(12) United States Patent
Wang et al.

(10) Patent No.: US 11,146,054 B2
(45) Date of Patent: Oct. 12, 2021

(54) SYSTEM AND METHOD FOR SHORT DETECTION IN A COMPUTING DEVICE

(71) Applicant: Dell Products L.P., Hopkinton, MA (US)

(72) Inventors: Isaac Q. Wang, Austin, TX (US); James L. Petivan, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 70 days.

(21) Appl. No.: 16/775,930

(22) Filed: Jan. 29, 2020

(65) Prior Publication Data

US 2021/0234355 A1 Jul. 29, 2021

(51) Int. Cl.
| | |
|---|---|
| *H02H 1/00* | (2006.01) |
| *H02H 3/00* | (2006.01) |
| *H02H 7/00* | (2006.01) |
| *H02H 7/20* | (2006.01) |
| *G01R 31/28* | (2006.01) |
| *G01R 31/52* | (2020.01) |
| *H01R 12/73* | (2011.01) |

(52) U.S. Cl.
CPC ......... *H02H 1/003* (2013.01); *G01R 31/2812* (2013.01); *G01R 31/52* (2020.01); *H02H 7/20* (2013.01); *H01R 12/737* (2013.01)

(58) Field of Classification Search
CPC ............ H02H 3/00; H02H 1/003; H02H 7/20; H02H 1/00; G01R 31/2812–2815; G01R 31/52; G01R 31/02; G01R 31/317
See application file for complete search history.

(56) References Cited

U.S. PATENT DOCUMENTS

| | | | | |
|---|---|---|---|---|
| 4,473,719 | A * | 9/1984 | Embree | H04M 19/026 379/382 |
| 6,424,513 | B1 * | 7/2002 | Wissell | H02H 3/247 361/100 |
| 8,773,271 | B1 * | 7/2014 | Stevens | G08B 21/20 340/604 |
| 2006/0294437 | A1 * | 12/2006 | Washburn | G06F 1/26 714/42 |
| 2009/0178937 | A1 * | 7/2009 | Taylor | G01N 27/3273 205/792 |
| 2012/0120577 | A1 * | 5/2012 | Chun | G06F 1/185 361/679.02 |
| 2015/0192629 | A1 * | 7/2015 | Petivan, III | H02H 1/0038 361/88 |
| 2018/0316082 | A1 * | 11/2018 | Keller, III | H01Q 1/2275 |

* cited by examiner

*Primary Examiner* — Sisay G Tiku
(74) *Attorney, Agent, or Firm* — Chamberlain, Hrdlicka, White, Williams & Aughtry

(57) ABSTRACT

A computing device includes a module that connects to a main board and a short detector. The short detector applies a voltage to a first electrical contact of the module; while the voltage is applied: makes a comparison of a second voltage on a second electrical contact of the module to the voltage; makes a determination, based on the comparison, that the first electrical contact is connected to the second electrical contact via a short circuit; and in response to the determination, initiates remediation of the short circuit.

18 Claims, 9 Drawing Sheets

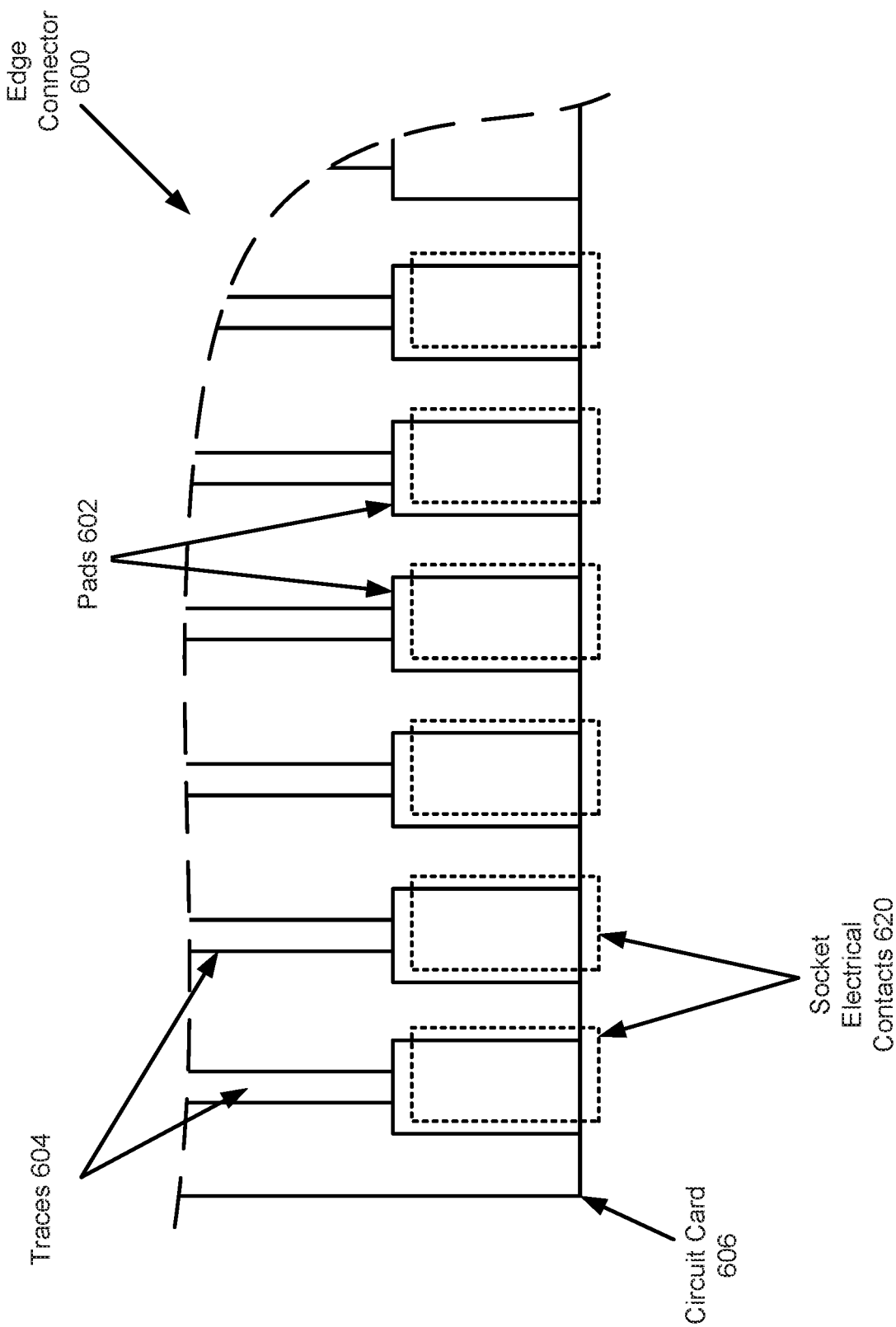
FIG. 6.1

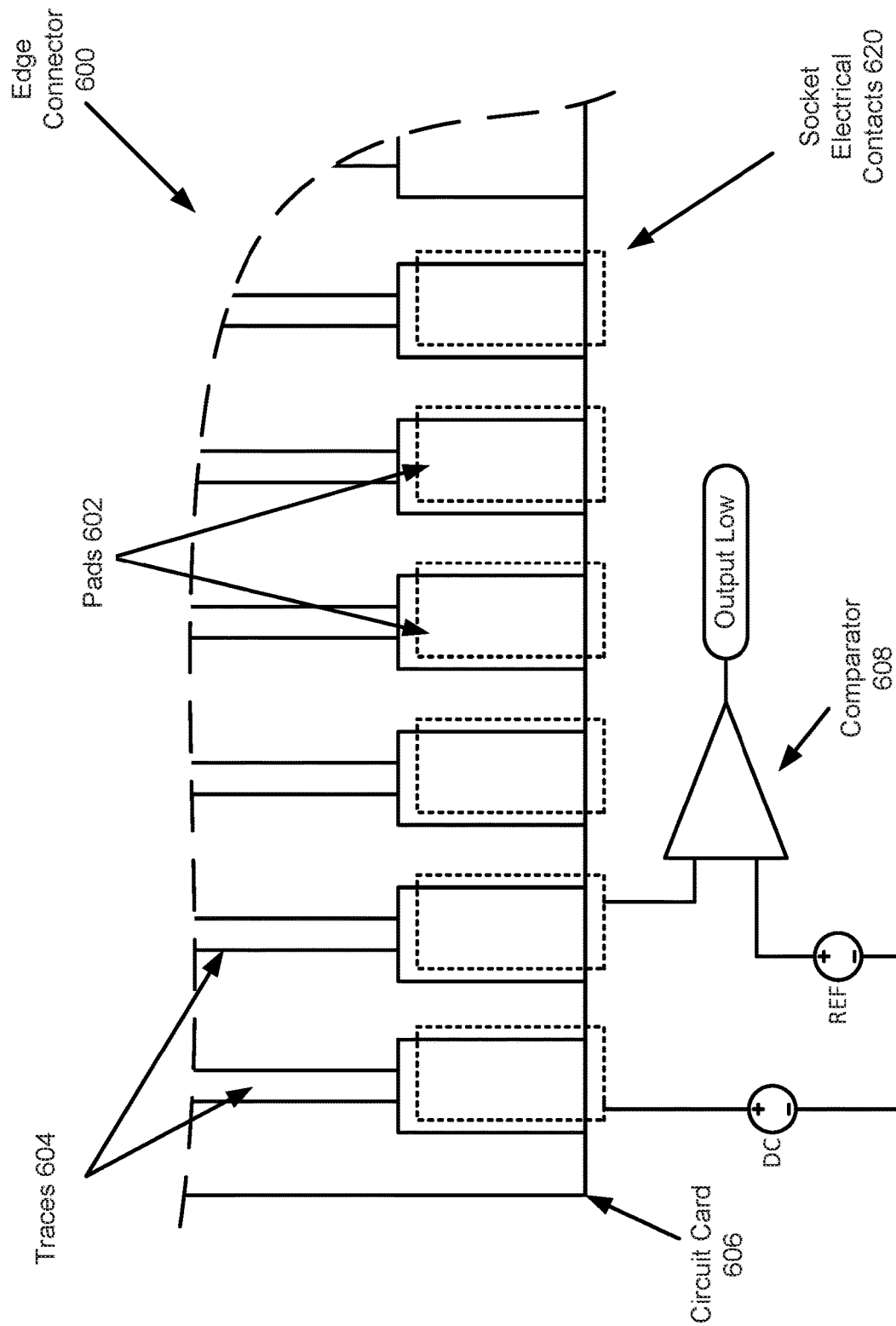
FIG. 6.2

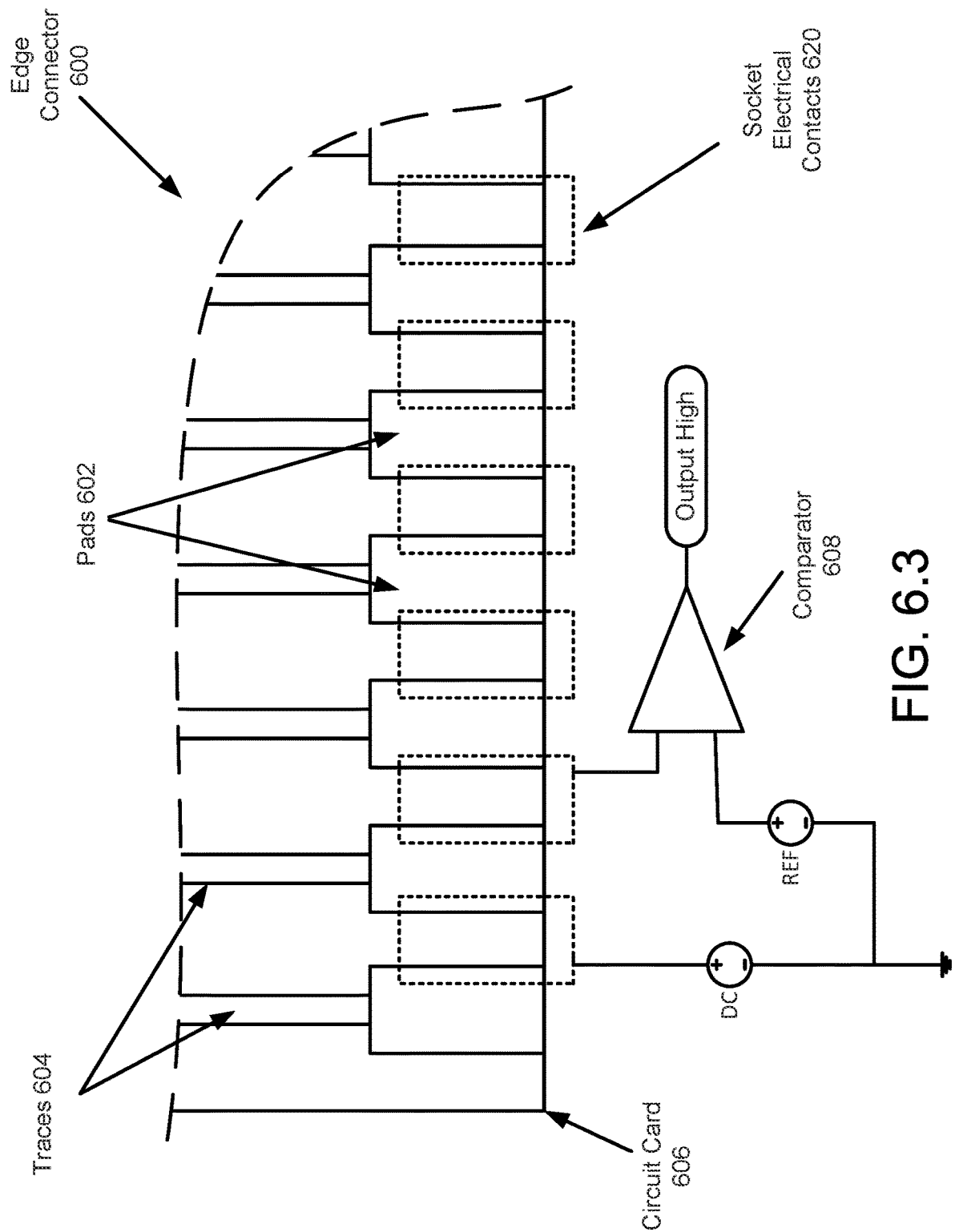
FIG. 6.3

SYSTEM AND METHOD FOR SHORT DETECTION IN A COMPUTING DEVICE

BACKGROUND

Computing devices may perform services. To provide the services, the computing devices may include hardware components and software components. The software components may utilize the hardware components to provide the services.

SUMMARY

In one aspect, a computing device in accordance with one or more embodiments of the invention includes a module that connects to a main board and a short detector. The short detector applies a voltage to a first electrical contact of the module; while the voltage is applied: makes a comparison of a second voltage on a second electrical contact of the module to the voltage; makes a determination, based on the comparison, that the first electrical contact is connected to the second electrical contact via a short circuit; and in response to the determination, initiates remediation of the short circuit.

In one aspect, a short detector in accordance with one or more embodiments of the invention includes a voltage source that applies a voltage to a first electrical contact of a module during a short test and a comparator. The comparator performs a comparison between the voltage and a second voltage on a second electrical contact of the module; makes a determination, based on the comparison, that the first electrical contact is connected to the second electrical contact via a short circuit; and, in response to the determination, initiates remediation of the short circuit.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIGS. 6.1-6.3 show diagrams of an example system over time.

DETAILED DESCRIPTION

Figure 1:
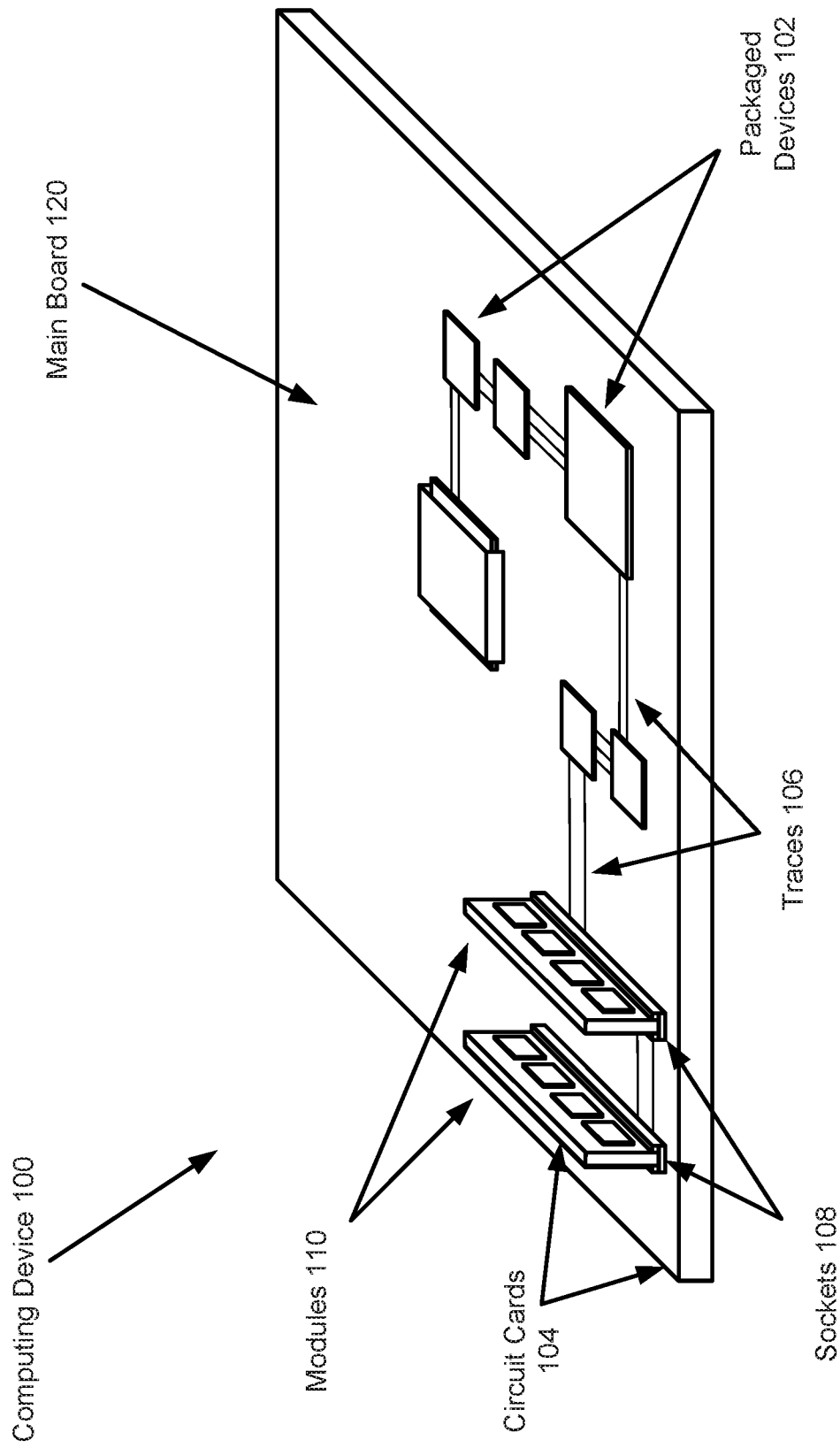
FIG. 1 shows a diagram of a system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout this application, elements of figures may be labeled as A to N. As used herein, the aforementioned labeling means that the element may include any number of items and does not require that the element include the same number of elements as any other item labeled as A to N. For example, a circuit may include a first element labeled as A and a second element labeled as N. This labeling convention means that the circuit may include any number of the elements. A second circuit, also labeled as A to N, may also include any number of elements. The number of elements of the first circuit and the number of elements of the second circuit may be the same or different.

In general, embodiments of the invention relate to systems, devices, and methods for managing short states of modules of computing devices. A short state may refer to state of a module in which unintended operable connections have been formed. The unintended operable connections may cause electrical signal and/or electrical power to access portions of packaged devices that are not intended to receive such signals and/or electrical power.

To manage the short states, a computing device in accordance with embodiments of the invention may include a short detector that may be able to identify shorts between electrical contacts of connections between modules and a main board of a computing device. When a module is inserted into a socket of a main board, the module may be misaligned. When misaligned, unintended physical connections between electrical contacts may be made thereby causing unintended operable connections to be formed.

The short detector may identify the shorts by applying voltage to a first electrical contact and monitor the voltage at the second electrical contact. The monitoring may, depending on the voltage levels, indicate that a short between the electrical contacts is present thereby indicating that the module is in a shorted state.

Once detected, the short detector may provide information to other entities to indicate the presence of the shorted state. Such information may be aggregated in, for example, a table and may be used during the start up of the computing device to remediate the short states.

By monitoring and proactively addressing short states, a computing device in accordance with embodiments of the invention may be less likely to have its modules damaged or its operation degraded due to shorts in modules. Consequently, the computing devices in accordance with embodiments of the invention may be less costly to operate, require less effort to debug errors, and/or may have improved uptime by proactively remediating potential issues that may render the computing device inoperable or less operable.

FIG. 1 shows a system in accordance with one or more embodiments of the invention. The system may provide computer implemented services. The computer implemented services may include, for example, database services, data storage services, electronic communications services, and/or other types of services that may be implemented using computing devices.

The system may include a computing device (100). The computing device (100) may provide all, or a portion, of the computer implemented services.

To provide computer implemented services, the computing device (100) may include packaged devices (102) operably connected to each other via one or more circuit cards (104). The packaged devices (102) may be electronic devices such as, for example, processors, programmable gate arrays, application specific integrated circuits (ASICs), memory devices, etc. The electronic devices may be other types of electric devices (e.g., devices other than digital logic devices including, for example, power electronics devices, analog devices, electromechanical devices, etc.) without departing from the invention.

The circuit cards (104) may be devices that provide interconnection services to the packaged devices (102) and/or other types of devices. The circuit cards (104) may provide additional and/or different types of services without departing from the invention.

The circuit cards (104) may be, for example, printed circuit boards (PCBs). The circuit cards (104) may be planar structures that include any number of layers. The layers may include, for example, metallization layers and dielectric layers. The metallization layers may be patterned in two dimension to form traces (106) to facilitate selective transmission of electric signals along the length and width of the circuit cards (104). The dielectric layers may electrically isolate the metallization layers from each other.

While the circuit cards (104) have been described as being implemented as PCBs, the circuit cards may be implemented using other interconnection technologies such as, for example, metallized polymer films, metallized wafers, and/or other types of structures that facilitate selective transmission of electronic signals between devices.

The computing device (100) may also include modules (108). A module may be an aggregation of packaged devices disposed on a circuit card that is electrically and/or physically connected to a second circuit card. For example, memory used in computing devices may be implemented as modules.

Modules (110) may need to be physically connected to a main board (120) for the packaged devices disposed on the circuit cards of the modules to operably connected to the packaged devices disposed on the main board (120). To enable such connections to be made, the modules (110) may include a connector (not shown) such as, for example, an edge connector and the main board (120) may include a receiver such as, for example, a socket (e.g., 108). The connector and socket may each include respective sets of electrical contacts. When the connector is optimally disposed in the socket, physical connections between the respective sets of electrical contacts may be formed. The arrangement of the socket and the connector may be different (e.g., reversed) without departing from the invention. For additional details regarding connectors, refer to FIG. 2.

When the modules (110) are optimally connected to the main board (120), circuitry including traces (106) on the main board (120) may interconnect the packaged devices on the modules and the main board by virtue of the physical connections between the respective set of electrical contacts. However, when the modules (110) are not optimally connected to the main board (120) due to, for example, misalignment of the connector of a module with a corresponding socket, unintended operable connections (e.g., connections over which electrical signals/power may flow) may be formed. For example, traces (106) that are not intended to be connected to each other may become connected to each other due to, for example, shorting between electrical contacts of the connectors and sockets. The unintended operable connections may be formed due to other reasons associated with suboptimal connections between the connectors and sockets of the modules (110) and main board (120), respectively, without departing from the invention.

When an unintended operable connection is formed, the connected packaged devices may (i) not operate correctly, (ii) may operate in a manner that degrades or prevents the operation of the computing device (100), and/or (iii) may damage the packaged devices of the modules (110) and/or the main board (120). For example, an unintended operable connection may operably connect a power source to a signal line of a packaged device. The power source may cause current to flow into a packaged device via the signal line thereby damaging the packaged device.

Embodiments of the invention may provide a method and system for managing unintended operable connections formed due to short circuits or other type of unexpected physical connections between modules (110) and the main board (120) of the computing device (100). To manage the aforementioned unintended operable connections, embodiments of the invention provide a computing device that may (i) perform an electrical validation test of one or more modules prior to starting (e.g., providing power, initializing the packaged devices, etc.) the modules, (ii) identify packaged devices that are likely to be operably connected in unintended manners based on the electrical validation test, and (iii) remediate the unintended operable connections prior to starting the modules.

To perform the electrical validation test, a computing device in accordance with embodiments of the invention may include a short detector on a main board that ascertains whether vulnerable portions of packaged devices of modules and/or the main board (120) are likely to be in a shorted out state (e.g., state in which electrical connections to the vulnerable portions are shorted to electrical connections which are likely to cause electrical signals/deliver power in a manner that is likely to damage or otherwise degrade the operation of the vulnerable portions). The short detector may provide information regarding the outcome of the electrical validation test to enable them to remediate any devices in a shorted out state. For additional details regarding the short detector, refer to FIGS. 3 and 4.

While the computing device (100) of FIG. 1 is illustrated as including a limited number of specific component, a computing device in accordance with embodiments of the invention may include additional, fewer, and/or different components without departing from the invention. For an example of a computing device, refer to FIG. 7.

Figure 2:
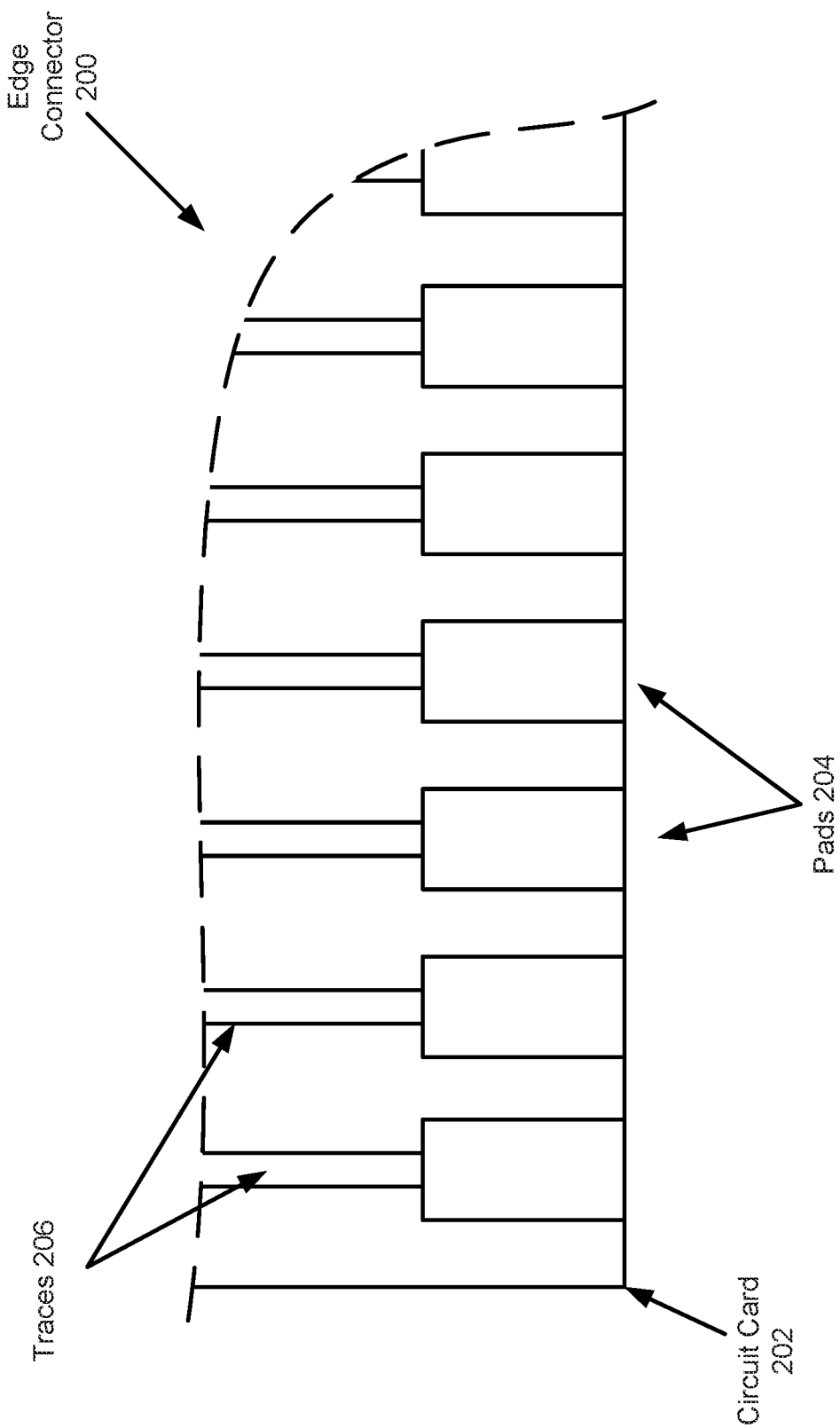
FIG. 2 shows a diagram of a connector of a module in accordance with one or more embodiments of the invention.

As discussed above, modules may include connectors that may be susceptible to shorting between the contacts of the connector and/or other portions of circuit cards. FIG. 2 shows a top view diagram of a portion of a connector in accordance with one or more embodiments of the invention. Specifically, FIG. 2 shows a top view diagram of a portion of an edge connector of a module that may be physically disposed into a socket to form electrical connections between pads (204) (e.g., electrical contacts) of the edge connector (200) and corresponding electric contacts on a socket.

Pads (204) may be any number of planar portions of metal (e.g., portions of a patterned layer of metallization) on a surface of a circuit card (202). The pads (204) may be adapted to form electrical connections with corresponding electrical contacts on a socket of a main board. The pads (204) may have a size, shape, and/or be positioned at predetermined locations that enable the pads (204) to be placed into contact with corresponding electronic contacts on a socket when a module is optimally disposed in a socket.

The pads (204) may be connected to packaged devices disposed on the module via traces (206) that connect the respective pads to the packaged devices. The pads may, for example, connect to a pin or other type of electrical contact on a packaged electronic device of the module. Consequently, the packaged devices of the module may be operably connected to traces disposed on the main board by way of the traces (206), pads (204), and corresponding electronic contacts disposed on the socket. Accordingly, when the module is disposed in the socket, the packaged devices may be operably connected to other packaged devices and/or other types of devices when the module is optimally disposed in the socket.

However, when the module is not optimally disposed in the socket, the pads (204) may be misaligned with the electronic contacts of the socket. Consequently, the electrical contacts on the socket may bridge gaps between the pads (204) causing any number of the pads (204) to become shorted to one another. Additionally, the pads may be placed in contact with different electrical contacts of the connector than would be in contact when the module is optimally disposed in the socket. Consequently, unintended operable connections may be formed between packaged devices of the module and main board.

Figure 3:
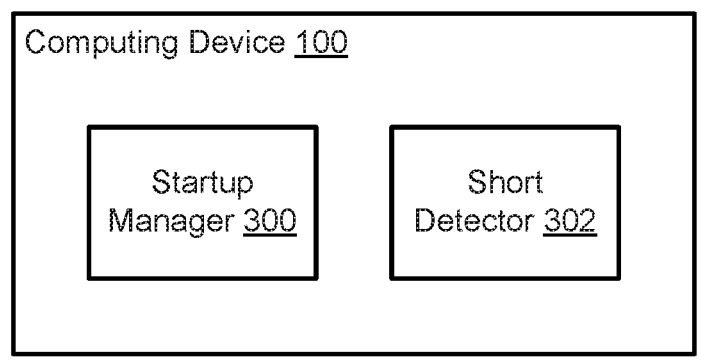
FIG. 3 shows a diagram of a computing device in accordance with one or more embodiments of the invention.

As discussed above, a computing device in accordance with embodiments of the invention may proactively address unintended operable connections. FIG. 3 shows a logical diagram of a computing device (100) in accordance with embodiments of the invention. The computing device may include a startup manager (300) and a short detector (302). Each of these components of the computing device is discussed below.

The startup manager (300) may manage the process of starting the computing device (100). Starting the computing device (100) may include powering of packaged devices. However, as noted above, if modules are operably connected in an unintended manner, powering or otherwise using packaged devices may be problematic.

To address this issue, the startup manager (300) may utilize a short detector (302) to ascertain whether one or more packaged devices are in a shorted state. To do so, the startup manager (300) may power the short detector (302) and obtain information from the short detector (302) once powered. The information may specify whether one or more packaged electronic devices are in a shorted state.

A shorted state may refer to a condition whether at least two of the pads of a connector of a module have a lower than expected resistance. The resistance would normally be expected to be large (open circuit). However, if an electrical contact of a socket was bridging the gap between the pads, the electrical resistance between the pads may be reduced (e.g., short circuited or reduced to a lower value than is required for operation as designed). If a packaged device is identified as being in a shorted state, the startup manager (300) may take action to remediate the shorted state.

Figure 5:
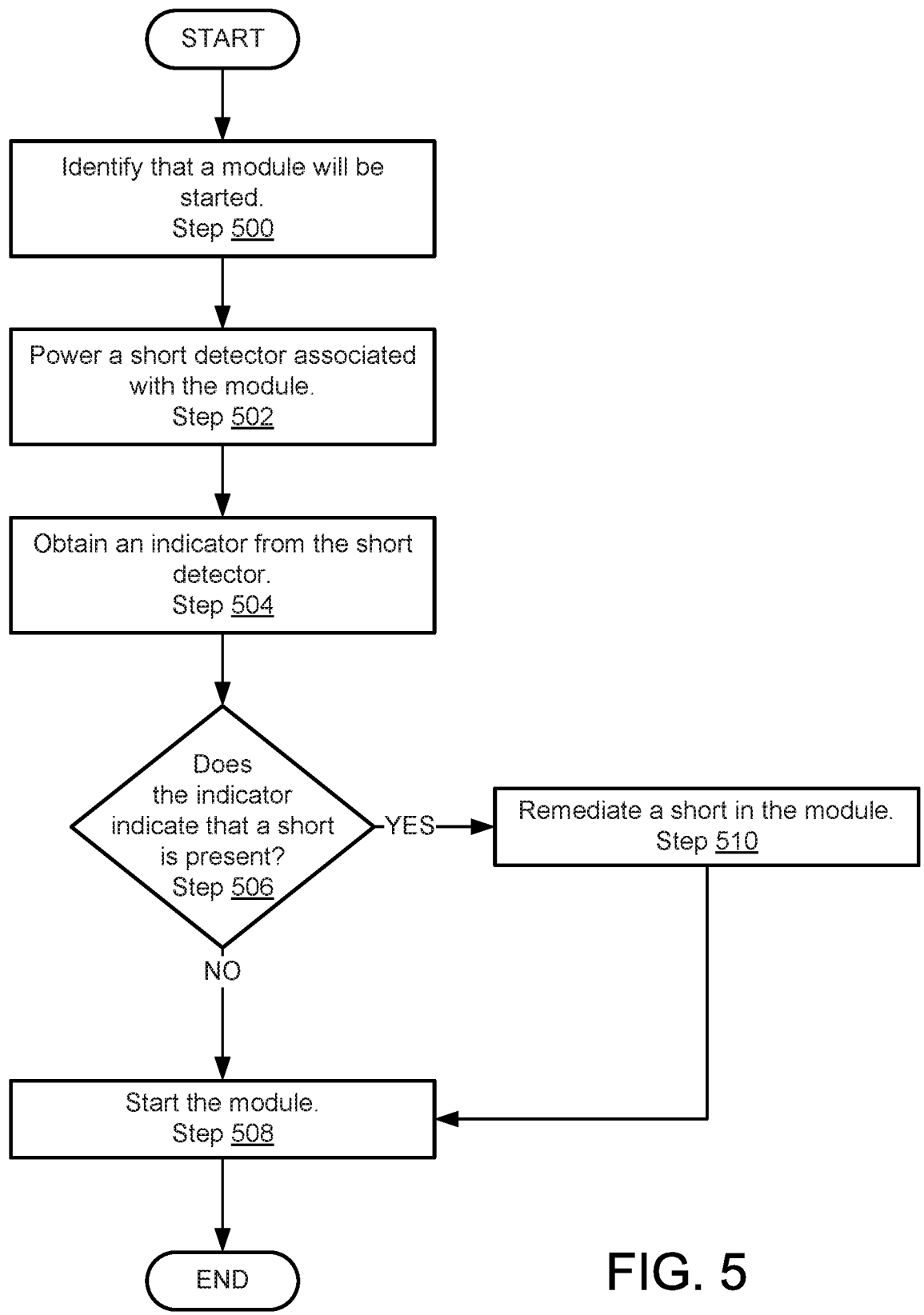
FIG. 5 shows a flow chart of a method of starting a module of a computing device in accordance with one or more embodiments of the invention.

To provide the above noted functionality, the startup manager (300) may perform all, or a portion, of the method illustrated in FIG. 5.

In one or more embodiments of the invention, the startup manager (300) is implemented using a hardware device including circuitry. The hardware device may be, for example, a digital signal processor, a field programmable gate array, or an application specific integrated circuit. The startup manager (300) may be implemented using other types of hardware devices without departing from the invention.

In one or more embodiments of the invention, the startup manager (300) is implemented using computing code stored on a persistent storage (e.g., 706) that when executed by a processor performs the functionality of the startup manager (300). The processor may be a hardware processor (e.g., 702) including circuitry such as, for example, a central processing unit or a microcontroller. The processor may be other types of hardware devices for processing digital information without departing from the invention.

The short detector (302) may ascertain a short state (e.g., shorted out or not shorted out) of one or more modules. To do so, the short detector (302) may electrically interrogate the pads of the modules to ascertain whether the pads are shorted to one another. If the modules are determined to be in a shorted state, the short detector (302) may provide information regarding the shorted state to other entities such as the startup manager (300).

In one or more embodiments of the invention, the short detector (302) is implemented using a hardware device including circuitry. For additional details regarding implementing the short detector (302) using a hardware device, refer to FIG. 4.

In one or more embodiments of the invention, the short detector (302) is implemented using computing code stored on a persistent storage (e.g., 706) that when executed by a processor performs the functionality of the short detector (302). The processor may be a hardware processor (e.g., 702) including circuitry such as, for example, a central processing unit or a microcontroller. The processor may be other types of hardware devices for processing digital information without departing from the invention.

While the computing device (100) has been illustrated as including a limited number of specific components, a computing device in accordance with embodiments of the invention may include additional, less, and/or different components without departing from the invention.

Figure 4:
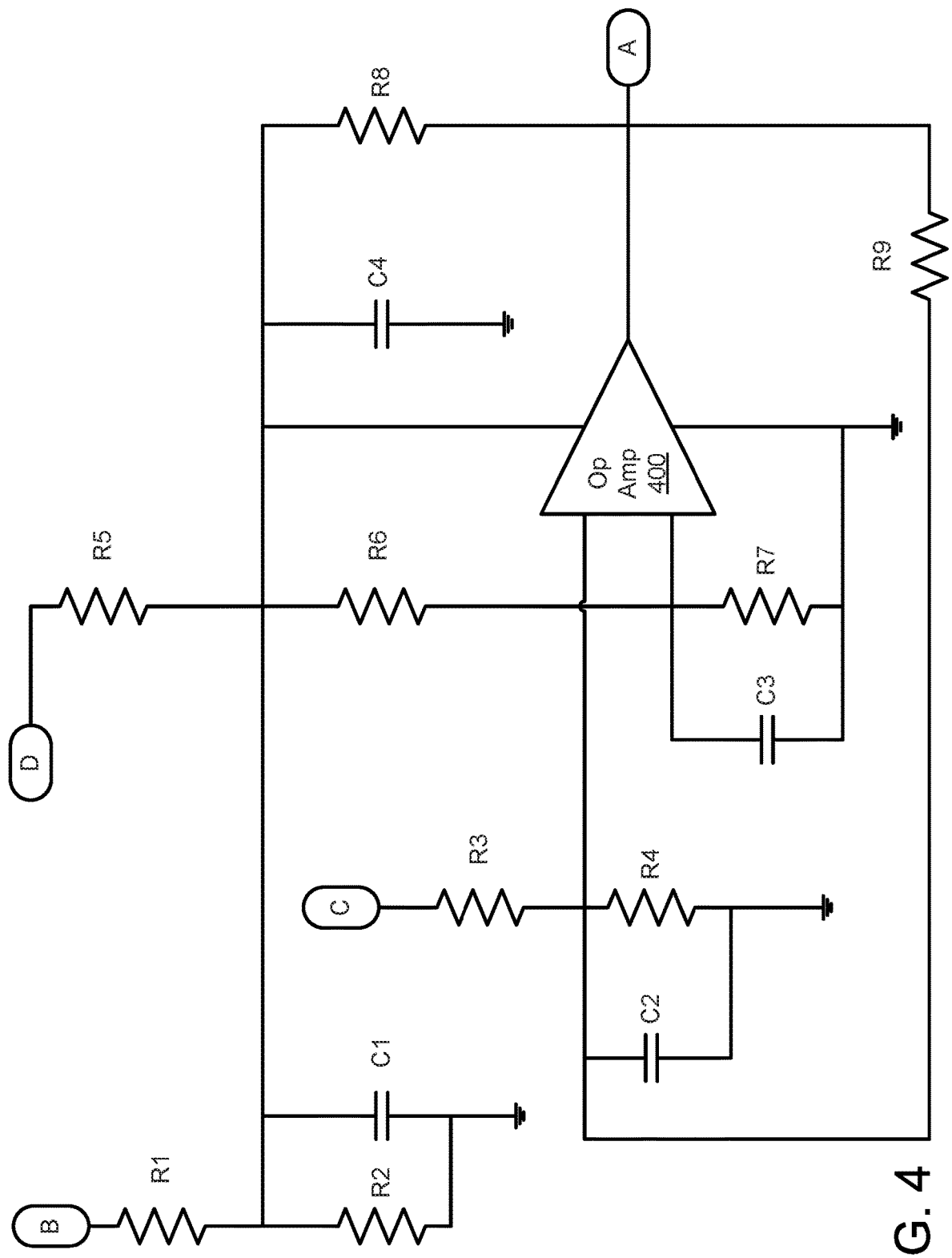
FIG. 4 shows a diagram of a short detector in accordance with one or more embodiments of the invention.

As discussed above, the short detector (302) may be implemented using hardware devices. FIG. 4 shows a schematic diagram of a short detector in accordance with one or more embodiments of the invention. In FIG. 4, boxes marked as A, B, C, and D refer to physical connections to other components, as will be discussed below.

The short detector (302) may be implemented using an operational amplifier (400) that compares two different voltages to ascertain whether two electrical contacts of a socket are shorted together. In other words, the operational amplifier (400) may be used as a comparator. Once the comparison is made, the operational output may output a voltage to the box marked A to indicate whether the electrical contacts are shorted together. The operational amplifier (400) may continue to output the voltage after the comparison is made regardless of whether the voltages on the electrical contacts changes. For example, the operational amplifier (400) may latch high preventing the output from changing. The box marked as A may connect to, for example, a packaged device on the main board used by the startup manager to obtain information regarding the short state of each of the modules. Similarly, the voltage supply connected to the box marked as B may connect to, for example, a packaged device on the main board used by the startup manager to selectively power the short detector during startups.

To make the comparison, a voltage (e.g., 12 volts but may vary depending on the desired voltage levels within the circuit) may be provided at B. The box marked D may be connected to a first electric contact of the socket and the box marked as C may be connected to a second electric contact of the socket. Consequently, when voltage is applied at B, if a short between the first and second electrical contacts is present, voltage may be applied at box C.

As seen from the diagram, box C may be connected to the first input to the operational amplifier (400) and box B is connected to the second input to the operational amplifier (400). Consequently, if a short is present (so long as the short is of reasonably low resistance) appropriate voltages will be present at the terminals of the operational amplifier (400) resulting in a comparison being performed that changes the output of the operational amplifier (400) to a high indicating that a short is present between the electrical connectors of the socket. After changing to a high, the operational amplifier (400) may continue to output a high signal regardless of whether the voltage at box C (i.e., the voltage on the second electrical contact) changes.

The values of the resistors (R1-R9) and the capacitors (C1-C4) may vary depending on (i) the type of operational amplifier used, (ii) the characteristics of the packaged device of the module disposed in the socket, and/or (iii) other variations.

For a specific example, consider a scenario where the packaged device is a DDR5 memory module, the first electrical contact of the socket connects to a signal line (e.g., power good/fail) of the memory module, and the second electric contact of the socket connects to a power reception line (e.g., Vin Bulk) of the memory module. In such a scenario, the signal line of the packaged device may be implemented in an open-drain signal.

In such a scenario, the R1 may be 2.21 kiloohms, R2 may be 820 ohms, R3-4 and R6 may each be 1 megaohm, R5 may be 1 kiloohms, R7 may be 66.5 kiloohms, R8 may be 4.75 kiloohm, and R9 may be 1 megaohm. C1 may be 0.1 microfarads, C2 may be 0.022 microfarads, C3 may be 0.01 microfarads, and C4 may be 0.1 microfarads. One of ordinary skill in the art will appreciate that the values of the aforementioned components may be changed, for example, to (i) implement different levels of voltage division to cause different voltages at the terminals of the operational amplifier (400) to cause the operational amplifier (400) to change its output to high, (ii) dampen or otherwise control transient signals, and/or (iii) otherwise tune the operation of the circuitry.

While the short detector has been illustrated as including a limited number of specific components connected in a specific manner, a short detector in accordance with embodiments of the invention may include additional, fewer, and/or different components connected in different manners without departing from the invention. For example, different types of components in different arrangement (and/or discrete components) may be utilized to form a comparator used to compare voltage levels on two different pins to ascertain whether conductors of a connector have been shorted to one another due to, for example, improper disposition of a connector in a corresponding socket.

As discussed above, the system of FIG. 1 may proactively address short states of modules. FIG. 5 shows methods that may be performed by components of the system of FIG. 1 to manage short states.

FIG. 5 shows a flowchart of a method in accordance with one or more embodiments of the invention. The method depicted in FIG. 5 may be used to manage the short state of a module in accordance with one or more embodiments of the invention. The method shown in FIG. 5 may be performed by, for example, a computing device (e.g., 100, FIG. 1).

While FIG. 5 is illustrated as a series of steps, any of the steps may be omitted, performed in a different order, additional steps may be included, and/or any or all of the steps may be performed in a parallel and/or partially overlapping manner without departing from the invention.

In step 500, a module that will be started is identified. The module may be identified by a startup manager. The startup manager may have access to information indicating the modules that will be started as part of a startup that is either (i) to be performed or (ii) in the process of being performed. The start manager may identify the module using the information.

In step 502, a short detector associated with the module is powered. The short detector may be associated with the module by being operably connected to electrical contacts of a socket in which the module is disposed. The short detector may be powered by applying a voltage at the box marked B in FIG. 4. The voltage may be a predetermined direct current voltage (e.g., 12 volts).

In step 504, an indicator is obtained form the short detector. The indicator may be an electrical signal. For example, the indicator may be a voltage at box A of FIG. 4. The voltage level may indicate whether module is in a short state.

For example, if the voltage is a logical level high voltage, the voltage level may indicate that the module is in the short state. If the voltage is a logical level low voltage, the voltage level may indicate that the module is not in the short state.

The short state may indicate that at least two electrical contacts of the socket are shorted together. However, any of the electrical contacts may be shorted together. For an example of such a scenario, refer to FIGS. 6.1-6.3.

In step 506, it is determined whether the indicator indicates that a short is present. As discussed above, the voltage level may indicate whether a short is present. If the indicator indicates that a short is present, the method may proceed to step 510. If the indicator does not indicate that a short is present, the method may proceed to step 508.

In step 508, the module is started. The module may be started, for example, by providing power to all, or a portion of the module. For example, power may be provided to a packaged device associated with the short detector. The module may be started as part of the process of starting the computing device.

The method may end following step 508.

Returning to step 506, the method may proceed to step 510 following step 506 if it is determined that the indicator indicates that a short is present.

In step 510, the short in the module is remediated.

In one or more embodiments of the invention, the short is remediated by not powering all, or a portion, of the module during and after a startup.

In one or more embodiments of the invention, the short is remediated by aborting a startup until the module is reseated to eliminate the short.

In one or more embodiments of the invention, the short is remediated by displaying an error message on a display of the computing device. The error may indicate that the module needs to be reseated, is inoperable, or requires some service.

Remediating the short may also include verifying that the short is no longer present. For example, one or more of steps 500, 502, 504, and/or 506 may be repeated.

Remediating the short may also include ending the method. For example, the method may end following step 508 following step 508 rather than proceeding to step 510.

The method may proceed to step 508 following step 510.

Using the method illustrated in FIG. 5, a computing device in accordance with embodiments of the invention may remediate shorts in modules.

To further clarify embodiments of the invention, a non-limiting example is provided in FIGS. 6.1-6.3. FIGS. 6.1-6.3 shows a system similar to that illustrated in FIG. 1 at different points in time. For the sake of brevity, only a limited number of components of the system of FIG. 1 are illustrated in each of FIGS. 6.1-6.3.

Example

Consider a scenario as illustrated in FIG. 6.1 in which an edge connector (600) of a module has been disposed (e.g., placed, inserted, positioned, etc.) in a socket (not shown). The edge connector (600) includes pads (602) connected to packaged devices of the module via traces (604) disposed on circuit card (606). To facilitate operable connections, the socket electrical contacts (620) have been placed in direct contact with the edge connector (600). The outlines of the socket electrical contacts (620) have been illustrated as rectangles with dashed edges superimposed over the edge connector (600).

As seen from FIG. 6.1, the socket electrical contacts (620) are well aligned with the pads (602) resulting in the socket electrical contacts (620) only coming into physical contact with corresponding pads (602) of the edge connector (600). Accordingly, none of the pads or socket electrical contacts (620) are electrically shorted to one another.

At a first point in time, the computing device, of which the edge connector (600) is a portion, begins to perform a startup. Turning to FIG. 6.2, when the computing device begins to perform a startup, a startup manager of the computing device initiates a short validation test for the module.

In FIG. 6.2, a simplified representation of the circuitry of the short manager is included. As discussed above, the aforementioned circuitry may operate, in part, as a comparator to identify whether at least two pins of a connector are shorted together (e.g., due to improper disposition in a socket). Specifically, the operational amplifier (400) illustrated in FIG. 4 may operate as a comparator. The simplified representation of the circuitry of FIG. 6.2 includes a comparator (608) to represent this aspect of the circuitry of the short manager. Consequently, the resistors, capacitors, some of the connections, and other components have been removed to highlight interconnections between the comparator and the socket's electrical contacts (620).

As seen from FIG. 6.2, a first electrical contact (left most) of the socket electrical contacts (620) is connected to a voltage source (DC in FIG. 6.2). The first input (top in FIG. 6.2) of the comparator (608) is connected to the second contact (second left most) of the socket electrical contacts (620). The second input of the comparator (608) is connected to a voltage reference (REF).

To ascertain whether a short is present, a DC voltage is applied (e.g., initiated by the startup manager by providing power to the short detector) to the first contact of the socket electrical contacts (620). Because the first contact is not connected to the second contact, the comparator (608) maintains an output low signal indicating that a short is not present. Accordingly, the startup manager updates a table that specifies the short state of the module as not being in a short state and proceeds to complete the startup.

After the startup is complete, the computing device in which the module is disposed begins to operate in a non-ideal manner. To remediate the non-ideal operation, a technician is tasked with attempting to restore the operation of the computing device to an ideal manner of operation. The technician shuts down the computing device and removes the module from the computing device. The technician then places the module back into the socket of the main board of the computing device.

However, as illustrated in FIG. 6.3, the technician does a poor job of reseating the module resulting in significant misalignment between the pads (602) and the socket electrical contacts (620). The misalignment is so significant that a pad (second left most) has shorted together the first and second socket electrical contacts (620).

After the module is reseated in the misaligned state, the technician hits the power button of the computing device to start it. In response, the startup manager beings to perform the startup-process including using the short detector to ascertain the short state of the module.

As seen in FIG. 6.3, due to the short between the first two socket electrical contacts (620), the voltage supplied by the DC source is applied to the first input to the comparator (608). Consequently, the voltage at the first input to the comparator (608) is of a predetermined value minimum value relative to that at the second input to the comparator (608). Accordingly, the comparator changes its operational state to output high.

In response to the output high state of the comparator (608), the startup manager ascertains that the module is in a short state by virtue of the comparator's (608) output high state. Accordingly, the startup manager takes action to remediate the short by disabling the module from being started up (e.g., keeps it from being powered up) and displays an error message on a display of the computing device. Consequently, the technician is made aware that the module needs to be serviced.

End of Example

Thus, as illustrated in FIGS. 6.1-6.3, embodiments of the invention may provide a computing device that proactively identifies the short state of modules disposed in the computing device. By doing so, the computing device may avoid damaging the modules or otherwise operating in a degraded manner if the modules are operated in the short state.

Figure 7:
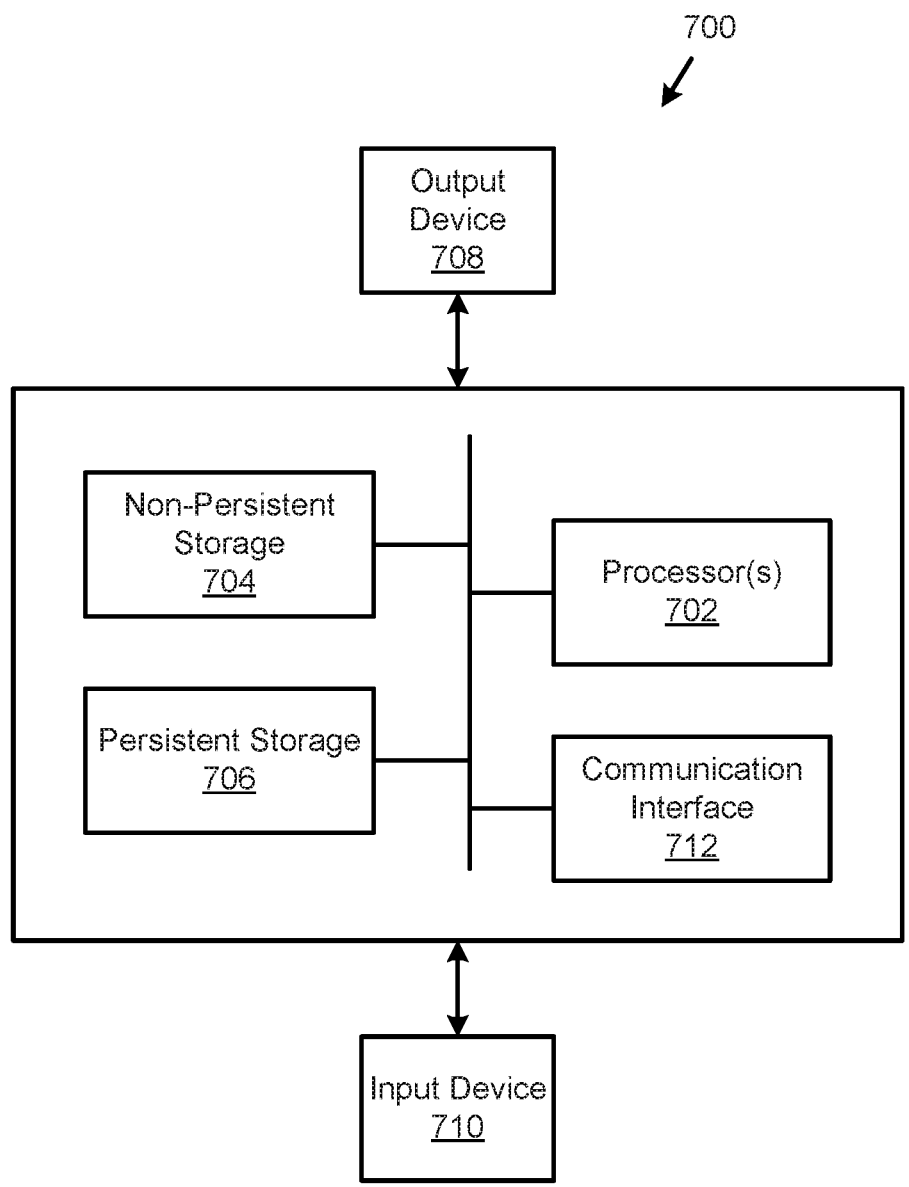
FIG. 7 shows a diagram of a computing device in accordance with one or more embodiments of the invention.

As discussed above, embodiments of the invention may be implemented using computing devices. FIG. 7 shows a diagram of a computing device in accordance with one or more embodiments of the invention. The computing device (700) may include one or more computer processors (702), non-persistent storage (704) (e.g., volatile memory, such as random access memory (RAM), cache memory), persistent storage (706) (e.g., a hard disk, an optical drive such as a compact disk (CD) drive or digital versatile disk (DVD) drive, a flash memory, etc.), a communication interface (712) (e.g., Bluetooth interface, infrared interface, network interface, optical interface, etc.), input devices (710), output devices (708), and numerous other elements (not shown) and functionalities. Each of these components is described below.

In one embodiment of the invention, the computer processor(s) (702) may be an integrated circuit for processing instructions. For example, the computer processor(s) may be one or more cores or micro-cores of a processor. The computing device (700) may also include one or more input devices (710), such as a touchscreen, keyboard, mouse, microphone, touchpad, electronic pen, or any other type of input device. Further, the communication interface (712) may include an integrated circuit for connecting the computing device (700) to a network (not shown) (e.g., a local area network (LAN), a wide area network (WAN) such as the Internet, mobile network, or any other type of network) and/or to another device, such as another computing device.

In one embodiment of the invention, the computing device (700) may include one or more output devices (708), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (702), non-persistent storage (704), and persistent storage (706). Many different types of computing devices exist, and the aforementioned input and output device(s) may take other forms.

Embodiments of the invention may provide a system for managing short states of modules of a computing device. To manage the short states, the system may proactively identify the short states and remediate an identified state. By doing so, embodiments of the invention may provide a system that (i) reduces the likelihood of short damaging components, (ii) reduces the likelihood that computing devices will be impacted by shorting of modules, and/or (iii) automatically remediates the short states.

Thus, embodiments of the invention may address the problems of short states of modules of computing devices due to misalignment or other issues between the module and a main board.

The problems discussed above should be understood as being examples of problems solved by embodiments of the invention and the invention should not be limited to solving the same/similar problems. The disclosed invention is broadly applicable to address a range of problems beyond those discussed herein.

One or more embodiments of the invention may be implemented using instructions executed by one or more processors of a computing device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as of the invention. Accordingly, the scope of the invention should be limited only by the attached claims.

What is claimed is:

1. A computing device, comprising:
   a module adapted to connect to a main board; and
   a short detector adapted to:
   apply a first voltage to a first electrical contact of the module; and
   while the first voltage is applied:
   make a comparison of the first voltage to a second voltage on a second electrical contact of the module;
   make a determination, based on the comparison, that the first electrical contact is connected to the second electrical contact via a short circuit;
   in response to the determination, initiate remediation of the short circuit; and
   after initiating the remediation:
   make a second comparison of the first voltage to the second voltage;
   make a second determination, based on the second comparison, that the first electrical contact is no longer connected to the second electrical contact via the short circuit; and
   after making the second determination, continue the remediation of the short circuit.

2. The computing device of claim 1, wherein the short circuit is remediated by aborting a startup of the module.

3. The computing device of claim 1, wherein the short detector comprises:
   a voltage source adapted to selectively apply the first voltage during a short detection test.

4. The computing device of claim 1, wherein the short detector further comprises:
   a comparator adapted to:
   obtain the first voltage as a first input,
   obtain the second voltage as a second input; and
   perform the comparison using the first input and the second input.

5. The computing device of claim 1, wherein the second electrical contact is adapted to receive power.

6. The computing device of claim 5, wherein the first electrical contact is adapted to communicate with another device.

7. The computing device of claim 1, wherein the short circuit is a partial short circuit.

8. The computing device of claim 1, wherein the short circuit is a total short circuit.

9. The computing device of claim 1, wherein the initiating remediation of the short circuit comprises:
   enabling a map to be updated based on the determination, wherein the map specifies whether the module is in a shorted out state.

10. A short detector, comprising:
    a voltage source adapted to apply a first voltage to a first electrical contact of a module during a short test; and
    a comparator adapted to:
    perform a comparison between the first voltage and a second voltage on a second electrical contact of the module;
    make a determination, based on the comparison, that the first electrical contact is connected to the second electrical contact via a short circuit; and
    in response to the determination, initiate remediation of the short circuit; and
    after initiating the remediation:
    make a second comparison of the first voltage to the second voltage;
    make a second determination, based on the second comparison, that the first electrical contact is no longer connected to the second electrical contact via the short circuit; and
    after making the second determination, continue the remediation of the short circuit.

11. The short detector of claim 10, wherein the short circuit is remediated by aborting a startup of the module.

12. The short detector of claim 10, wherein the voltage source is further adapted to remove the first voltage when the short test is complete.

13. The short detector of claim 10, wherein the comparator comprises:
   an operational amplifier adapted to:
      obtain the first voltage as a first input,
      obtain the second voltage as a second input; and
      perform the comparison using the first input and the second input.

14. The short detector of claim 10, wherein the second electrical contact is adapted to receive power.

15. The short detector of claim 14, wherein the first electrical contact is adapted to communicate with another device.

16. The short detector of claim 10, wherein the short circuit is a partial short circuit.

17. The short detector of claim 10, wherein the short circuit is a total short circuit.

18. The short detector of claim 10, wherein the initiating remediation of the short circuit comprises:
   enabling a map to be updated based on the determination, wherein the map specifies whether the module is in a shorted out state.

* * * * *